US012720208B2

(12) United States Patent
Nashizawa et al.

(10) Patent No.: US 12,720,208 B2
(45) **Date of Patent: *Aug. 25, 2026**

(54) IMAGE PROCESSING APPARATUS, IMAGE CAPTURING APPARATUS, CONTROL METHOD, AND STORAGE MEDIUM

(71) Applicant: CANON KABUSHIKI KAISHA, Tokyo (JP)

(72) Inventors: Hiroaki Nashizawa, Tokyo (JP); Kota Terayama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 47 days.

This patent is subject to a terminal disclaimer.

(21) Appl. No.: 18/916,030

(22) Filed: Oct. 15, 2024

(65) Prior Publication Data

US 2025/0039554 A1 Jan. 30, 2025

Related U.S. Application Data

(63) Continuation of application No. 17/940,076, filed on Sep. 8, 2022, now Pat. No. 12,149,835.

(30) Foreign Application Priority Data

Sep. 13, 2021 (JP) ................................ 2021-148905

(51) Int. Cl.
*H04N 23/73* (2023.01)
*G03F 7/20* (2006.01)
*H04N 23/72* (2023.01)

(52) U.S. Cl.
CPC ............... *H04N 23/73* (2023.01); *G03F 7/20* (2013.01); *H04N 23/72* (2023.01)

(58) Field of Classification Search
CPC ...... H04N 23/73; H04N 23/72; H04N 23/741; H04N 23/743; G03F 7/20; G06T 5/92;
(Continued)

(56) References Cited

U.S. PATENT DOCUMENTS 12,149,835 B2 * 11/2024 Nashizawa ........... H04N 23/72
2011/0254976 A1 10/2011 Garten
(Continued)

FOREIGN PATENT DOCUMENTS

CN 111866399 A 10/2020
EP 3917138 A1 12/2021
(Continued)

OTHER PUBLICATIONS

European Search Report issued on May 19, 2025, which is enclosed, that issued in the corresponding European Patent Application No. 22191631.5.
(Continued)

*Primary Examiner* — Christopher K Peterson
(74) *Attorney, Agent, or Firm* — Cowan, Liebowitz & Latman, P.C.

(57) ABSTRACT

An image processing apparatus that composites a plurality of images that have been captured with different exposure amounts, the image processing apparatus comprising at least one processor and/or circuit configured to function as following units: a specification unit configured to specify a signal value indicating an upper limit value of an output dynamic range with respect to at least one of the plurality of images; and a decision unit configured to decide on composition percentages of the plurality of images based on the signal value specified by the specification unit.

19 Claims, 9 Drawing Sheets

(58) Field of Classification Search
CPC . G06T 2207/10144; G06T 2207/20208; G06T 2207/20221; G06T 5/50
See application file for complete search history.

(56) References Cited

U.S. PATENT DOCUMENTS

| | | | |
|---|---|---|---|
| 2012/0327270 | A1 | 12/2012 | Shirakawa |
| 2014/0002694 | A1 | 1/2014 | Levy |
| 2015/0356904 | A1 | 12/2015 | Nakatani |
| 2016/0334696 | A1 | 11/2016 | Schuck |
| 2017/0019651 | A1 | 1/2017 | Kitajima |
| 2017/0279530 | A1 | 9/2017 | Tsukagoshi |
| 2017/0289460 | A1 | 10/2017 | Hawkins |
| 2018/0084174 | A1 | 3/2018 | Ishii |
| 2018/0124305 | A1 | 5/2018 | Kobayashi |
| 2020/0077069 | A1 | 3/2020 | Morotomi |
| 2021/0099633 | A1 | 4/2021 | Nakayama |

FOREIGN PATENT DOCUMENTS

| | | | |
|---|---|---|---|
| JP | 2013-009104 | A | 1/2013 |
| JP | 2013-240031 | A | 11/2013 |
| JP | 2020-039118 | A | 3/2020 |
| JP | 2021057626 | A | 4/2021 |

OTHER PUBLICATIONS

Jun. 28, 2024 Japanese Office Action, which is enclosed without an English Translation, that issued in Japanese Patent Application No. 2021-148905.

Tomislav Kartalov et al: "A Real Time Algorithm for Exposure Fusion of Digital Images", MELECON 2010-2010 15th IEEE Mediterranean Electrotechnical Conference, IEEE, Piscataway, NJ, USA, Apr. 26, 2010 (Apr. 26, 2010), pp. 641-646, XP031683329, ISBN: 978-1-4244-5793-9.

European Search Report issued on Feb. 1, 2023, which is enclosed, that issued in the corresponding European Patent Application No. 22191631.5.

* cited by examiner

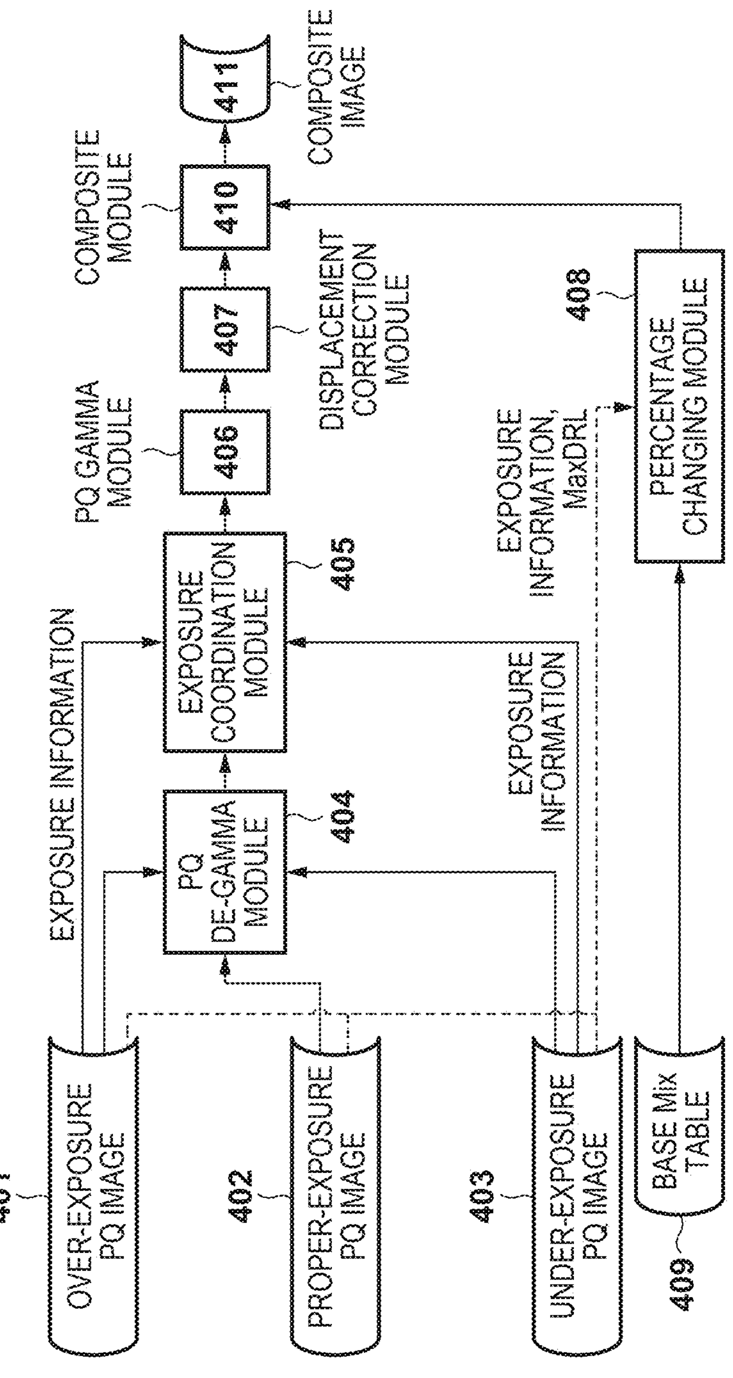
F I G. 4
401
OVER-EXPOSURE PQ IMAGE
402
PROPER-EXPOSURE PQ IMAGE
403
UNDER-EXPOSURE PQ IMAGE
BASE Mix TABLE
409
EXPOSURE INFORMATION
PQ DE-GAMMA MODULE
404
EXPOSURE COORDINATION MODULE
405
EXPOSURE INFORMATION
EXPOSURE INFORMATION, MaxDRL
PQ GAMMA MODULE
406
407
DISPLACEMENT CORRECTION MODULE
408
PERCENTAGE CHANGING MODULE
COMPOSITE MODULE
410
411
COMPOSITE IMAGE

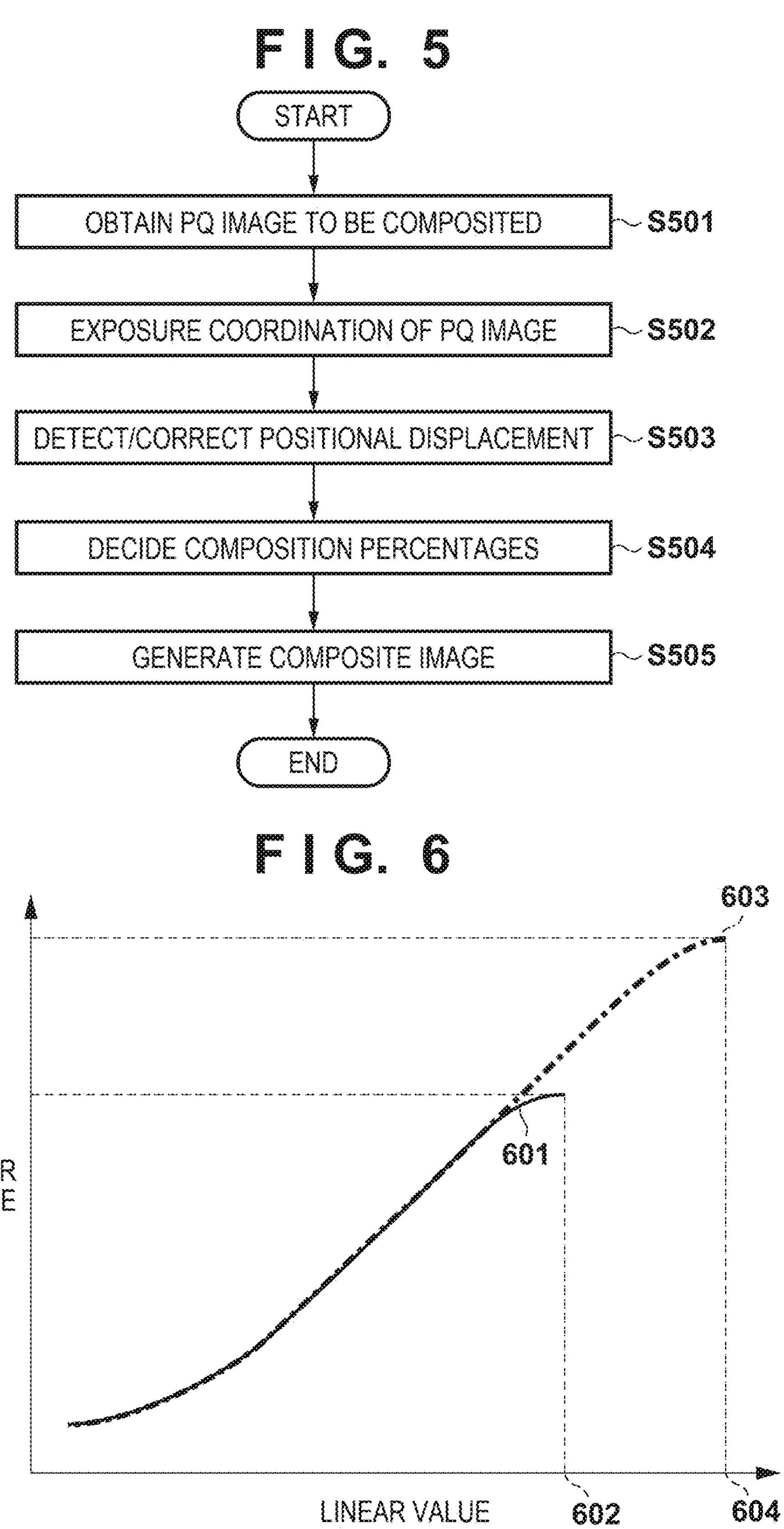
F I G. 5
START
OBTAIN PQ IMAGE TO BE COMPOSITED
S501
EXPOSURE COORDINATION OF PQ IMAGE
S502
DETECT/CORRECT POSITIONAL DISPLACEMENT
S503
DECIDE COMPOSITION PERCENTAGES
S504
GENERATE COMPOSITE IMAGE
S505
END
F I G. 6
603
601
NONLINEAR VALUE
LINEAR VALUE
602
604

Figures 8A, 8B, 9:
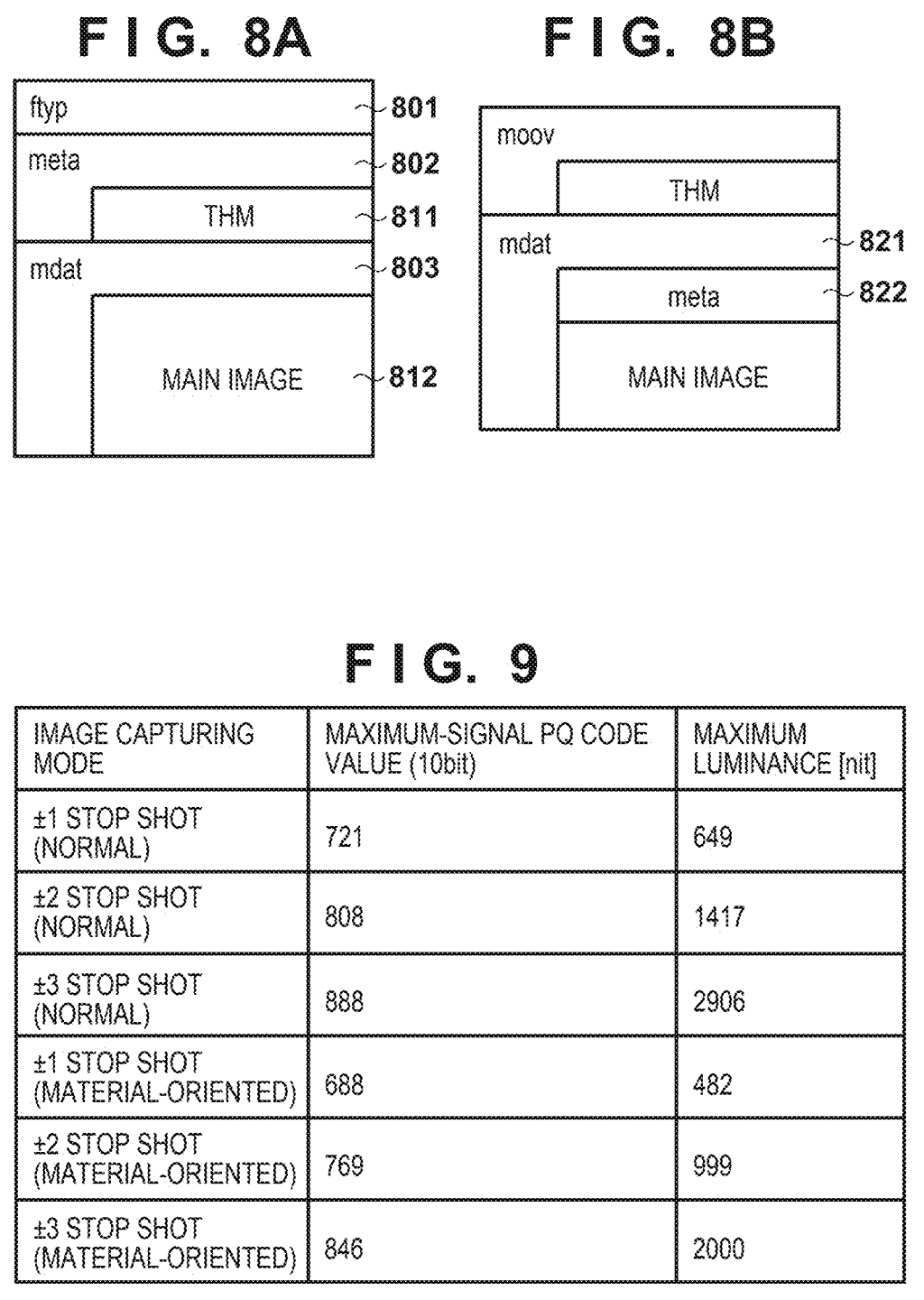

| IMAGE CAPTURING MODE | MAXIMUM-SIGNAL PQ CODE VALUE (10bit) | MAXIMUM LUMINANCE [nit] |
|---|---|---|
| ±1 STOP SHOT (NORMAL) | 721 | 649 |
| ±2 STOP SHOT (NORMAL) | 808 | 1417 |
| ±3 STOP SHOT (NORMAL) | 888 | 2906 |
| ±1 STOP SHOT (MATERIAL-ORIENTED) | 688 | 482 |
| ±2 STOP SHOT (MATERIAL-ORIENTED) | 769 | 999 |
| ±3 STOP SHOT (MATERIAL-ORIENTED) | 846 | 2000 |

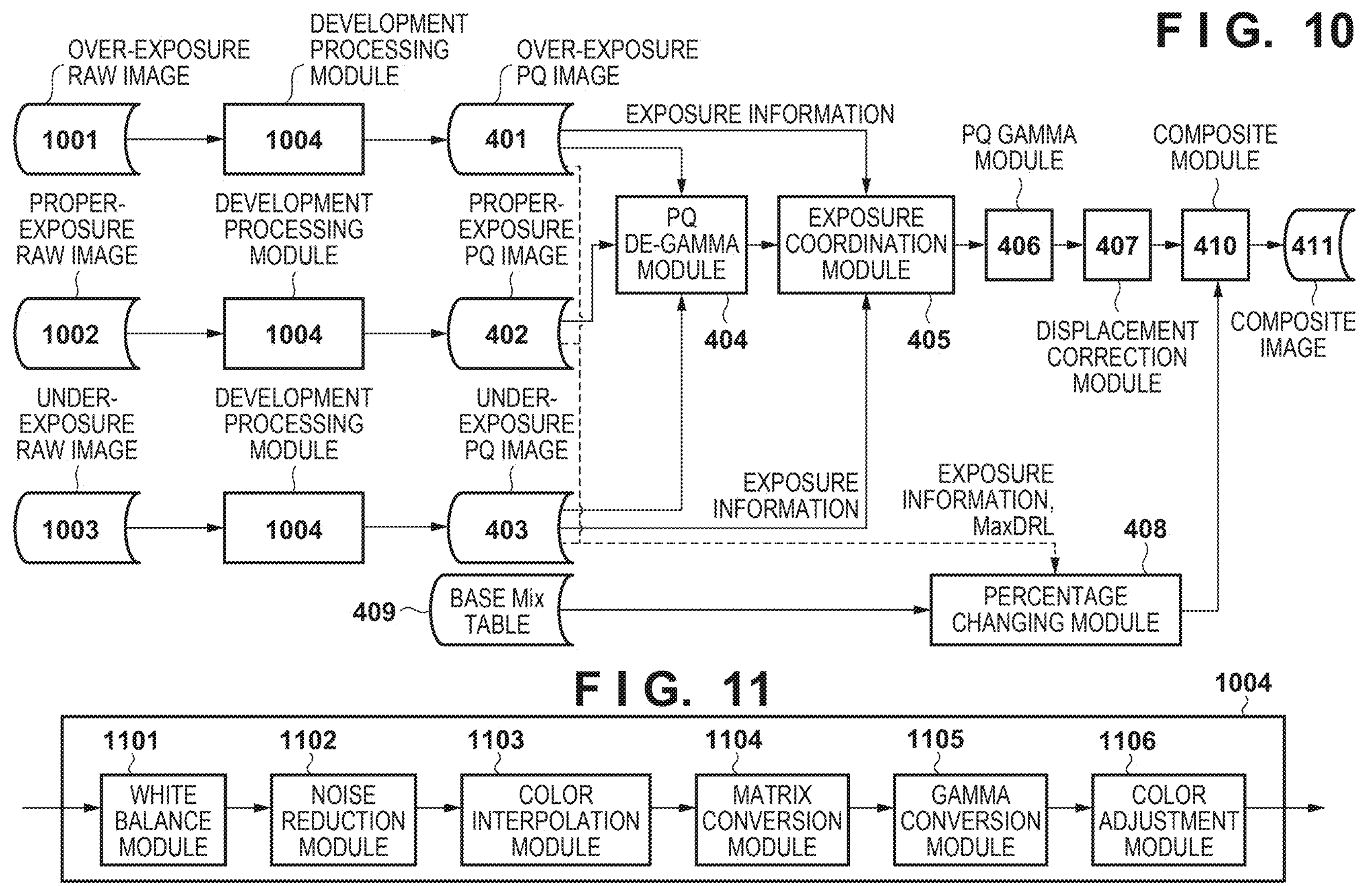
FIG. 10
OVER-EXPOSURE RAW IMAGE
1001
DEVELOPMENT PROCESSING MODULE
1004
OVER-EXPOSURE PQ IMAGE
401
PROPER-EXPOSURE RAW IMAGE
1002
PROPER-EXPOSURE PQ IMAGE
402
UNDER-EXPOSURE RAW IMAGE
1003
UNDER-EXPOSURE PQ IMAGE
403
EXPOSURE INFORMATION
PQ DE-GAMMA MODULE
404
EXPOSURE COORDINATION MODULE
405
PQ GAMMA MODULE
406
DISPLACEMENT CORRECTION MODULE
407
COMPOSITE MODULE
410
COMPOSITE IMAGE
411
EXPOSURE INFORMATION, MaxDRL
PERCENTAGE CHANGING MODULE
408
BASE Mix TABLE
409
FIG. 11
1004
1101
WHITE BALANCE MODULE
1102
NOISE REDUCTION MODULE
1103
COLOR INTERPOLATION MODULE
1104
MATRIX CONVERSION MODULE
1105
GAMMA CONVERSION MODULE
1106
COLOR ADJUSTMENT MODULE Over1End
Prop1End
1203
1201
WEIGHTED ADDITION PERCENTAGE
1202
Max(R,G,B)
Prop1Start, Under1Start Over1End
W
Prop1End
WEIGHTED ADDITION PERCENTAGE
Max(R,G,B)
Prop1Start
Under1Start Over1End
Prop1End
WEIGHTED ADDITION PERCENTAGE
Max(R,G,B)
Prop1Start
Under1Start

IMAGE PROCESSING APPARATUS, IMAGE CAPTURING APPARATUS, CONTROL METHOD, AND STORAGE MEDIUM

CROSS-REFERENCE TO RELATED APPLICATION

This application is a continuation of application Ser. No. 17/940,076, filed Sep. 8, 2022, the entire disclosure of which is hereby incorporated by reference.

BACKGROUND OF THE INVENTION

Field of the Invention

The present invention relates to an image processing apparatus, an image capturing apparatus, a control method, and a storage medium, and especially to a technique to composite image signals with a high dynamic range.

Description of the Related Art

There are techniques to generate a composite image with a high dynamic range (HDR), which is an extended dynamic range, by compositing a plurality of standard dynamic range (SDR) images obtained by shooting a scene with different exposure amounts. According to Japanese Patent Laid-Open No. 2013-240031, an HDR composite image is generated by compositing three types of SDR images, namely a proper-exposure image obtained through shooting with proper exposure, an under-exposure image obtained with underexposure, and an over-exposure image obtained with overexposure, in accordance with preset composition percentages. More specifically, luminance thresholds Y1, Y2, Y3, and Y4 (FIG. 10 of Japanese Patent Laid-Open No. 2013-240031) are set as composition bases, and composition is controlled so that an over-exposure image, a proper-exposure image, and an under-exposure image are used for a luminance range darker than Y1, a luminance range from Y2 to Y3, and a luminance range brighter than Y4, respectively. Also, with regard to intermediate ranges from Y1 to Y2 and from Y3 to Y4, composition is controlled so that the composition percentages (weighted addition coefficients) of an over-exposure image and a proper-exposure image, and of a proper-exposure image and an under-exposure image, are gradually changed, respectively. Due to such composition control, an HDR composite image with a favorably-extended dynamic range can be obtained from SDR images of three types of exposure conditions.

Furthermore, recent years have witnessed the improvements in the performances of light-emitting elements such as LEDs, and the emergence of display apparatuses called HDR displays, which have display luminance with a wide dynamic range compared to conventional counterparts. These display apparatuses can display images that have colors and details of a high luminance range (HDR images) more authentically. The Electro-Optical Transfer Function (EOTF) defines signal characteristics that indicate the relationship between a video signal level and display luminance in an HDR image, and the following two types of methods are used. One is a Hybrid Log Gamma (HLG) method standardized in ARIB STD-B67, with which a video signal level is converted into a relative value of display luminance, thereby achieving display luminance corresponding to the maximum luminance that can be output by a display apparatus. The other is a Perceptual Quantization (PQ) method standardized in the SMPTE ST 2084 or the ITU-R BT.2100, with which a video signal level is converted into an absolute value of display luminance within a range of up to 10,000 nits (or cd/$m^2$). Therefore, in a case where an HDR image obtained by shooting a scene is displayed, the former method converts scene luminance into display luminance corresponding to the maximum luminance that can be output by a display apparatus, whereas the latter method converts scene luminance into display luminance that is absolutely determined irrespective of a display apparatus. Therefore, in a case where display on a display apparatus that adopts the PQ method is expected, it is necessary to generate an HDR image by converting an image signal of scene luminance so that it indicates an absolute luminance value in, for example, encoding on an image capturing apparatus.

Incidentally, by obtaining the above-described HDR images with use of different exposure amounts with respect to a scene and compositing the HDR images, a composite image with a further-extended dynamic range can be generated. That is to say, a composite image that represents more details can be generated by compositing three types of HDR images, namely a proper-exposure HDR image obtained through shooting with proper exposure, an under-exposure HDR image obtained with underexposure, and an over-exposure HDR image obtained with overexposure, similarly to Japanese Patent Laid-Open No. 2013-240031.

Meanwhile, in encoding based on the PQ method that represents scene luminance in absolute terms, even if the same scene has been shot, the peak luminance included in an HDR image (the maximum value of display luminance and the maximum value of an output dynamic range) can vary depending on the difference in the exposure amount. This is because, since scene luminance corresponding to saturated sensor outputs changes depending on the exposure amount, different gamma curves are used in conversion so as to allocate absolute display luminance to the same scene luminance. For example, as shown in FIG. 1, the peak luminance (the maximum value of output luminance) varies between the input/output characteristics (the relationships between the number of stops associated with the input and output luminance) of two types of image capturing modes with different exposure amounts. Here, the input/output characteristic 11 in an image capturing mode with a large exposure amount is indicated by a solid line, whereas the input/output characteristic 12 in an image capturing mode with a small exposure amount is indicated by a dash-dot-dash line. As shown in the figure, in the two image capturing modes, the same input/output characteristic is exhibited and conversion results in the same display luminance irrespective of the exposure amount in a range other than a high luminance range, but the peak luminance has different values, namely 13 and 14, in accordance with the difference in saturated luminance in the high luminance range. Note that the value 15 indicates the maximum value at 10 bits (1023), which corresponds to 10,000 nits representing the maximum display luminance in the PQ method.

Therefore, simply applying the composition method of Japanese Patent Laid-Open No. 2013-240031 could possibly result in the failure to generate a favorable composite image. More specifically, in the composite method of Japanese Patent Laid-Open No. 2013-240031, as 8-bit SDR images to which pixel values of up to 255 are allocated for each exposure condition are assumed, the pixel values of both of two types of images can always be referred to in a luminance range in which the two types of images are composited. However, in a case where HDR images with different exposure amounts are composited, a high-exposure HDR image may not show a subject that exceeds the peak luminance in a luminance range in which two types of images are composited, which could lead to the possibility that a favorable composition result cannot be obtained.

For example, assume a case where the composition percentages of Japanese Patent Laid-Open No. 2013-240031 have been applied with respect to a mode in which the luminance of a proper-exposure HDR image is distributed as shown in a histogram 24 of FIG. 2 (the peak luminance of the proper-exposure HDR image is 25). In the figure, a dash-dot-dash line 21, a solid line 22, and a dash-dot-dot-dash line 23 respectively indicate a weighted addition coefficient of an over-exposure HDR image, a weighted addition coefficient of a proper-exposure HDR image, and a weighted addition coefficient of an under-exposure HDR image corresponding to the composition percentages of Japanese Patent Laid-Open No. 2013-240031, and the sum of the coefficients is one in every luminance range. At this time, in a case where a luminance range in which the proper-exposure HDR image and the under-exposure HDR image are composited (Y3 to Y4) includes the peak luminance 25 of the proper-exposure HDR image as shown in the figure, the proper-exposure HDR image is not composited in a luminance range from this peak luminance to Y4; this does not bring about a favorable composition result. In other words, as the proper-exposure HDR image does not include pixels with luminance not less than the peak luminance 25 due to saturation of sensor outputs, there is a possibility that a composite image includes an unnatural representation in a region in which subjects in the vicinity of this peak luminance are distributed.

As in the examples described above, there is a possibility that an unnatural image is obtained by compositing a plurality of images that are different from one another in the peak luminance.

SUMMARY OF THE INVENTION

The present invention has been made in view of the aforementioned problem, and provides an image processing apparatus, an image capturing apparatus, a control method, and a storage medium that decide on favorable composition percentages in relation to the generation of a composite image with an extended dynamic range.

The present invention in its first aspect provides an image processing apparatus that composites a plurality of images that have been captured with different exposure amounts, the image processing apparatus comprising at least one processor and/or circuit configured to function as following units: a specification unit configured to specify a signal value indicating an upper limit value of an output dynamic range with respect to at least one of the plurality of images; and a decision unit configured to decide on composition percentages of the plurality of images based on the signal value specified by the specification unit.

The present invention in its second aspect provides an image capturing apparatus, comprising: the image processing apparatus of the first aspect; and an image capturing unit configured to capture the plurality of images with different exposure amounts.

The present invention in its third aspect provides a control method for an image processing apparatus that composites a plurality of images that have been captured with different exposure amounts, the method comprising: specifying a signal value indicating an upper limit value of an output dynamic range with respect to at least one of the plurality of images; and deciding on composition percentages of the plurality of images based on the signal value specified in the specifying.

The present invention in its fourth aspect provides a computer-readable storage medium storing a program that causes a computer to function as each unit of the image processing apparatus of the first aspect.

Further features of the present invention will become apparent from the following description of exemplary embodiments (with reference to the attached drawings).

BRIEF DESCRIPTION OF THE DRAWINGS

FIG. 4 is a block diagram exemplarily showing module constituents for composition processing according to a first embodiment of the present invention.

FIG. 5 is a flowchart exemplarily showing composition processing according to the first embodiment of the present invention.

FIG. 6 is a diagram for describing the difference between the characteristics of the OETF applied in accordance with an exposure amount in shooting and the OETF applied in association with the generation of a composite image.

FIGS. 8A and 8B are diagrams exemplarily showing an output file format of a composite image according to the embodiments and modifications of the present invention.

FIG. 9 is a diagram exemplarily showing MaxDRLs that have been determined in accordance with image capturing modes.

FIG. 10 is a block diagram exemplarily showing module constituents for composition processing according to a second embodiment of the present invention.

FIG. 11 is a block diagram exemplarily showing module constituents for development processing according to the second embodiment of the present invention.

DESCRIPTION OF THE EMBODIMENTS

First Embodiment

Figure 1:
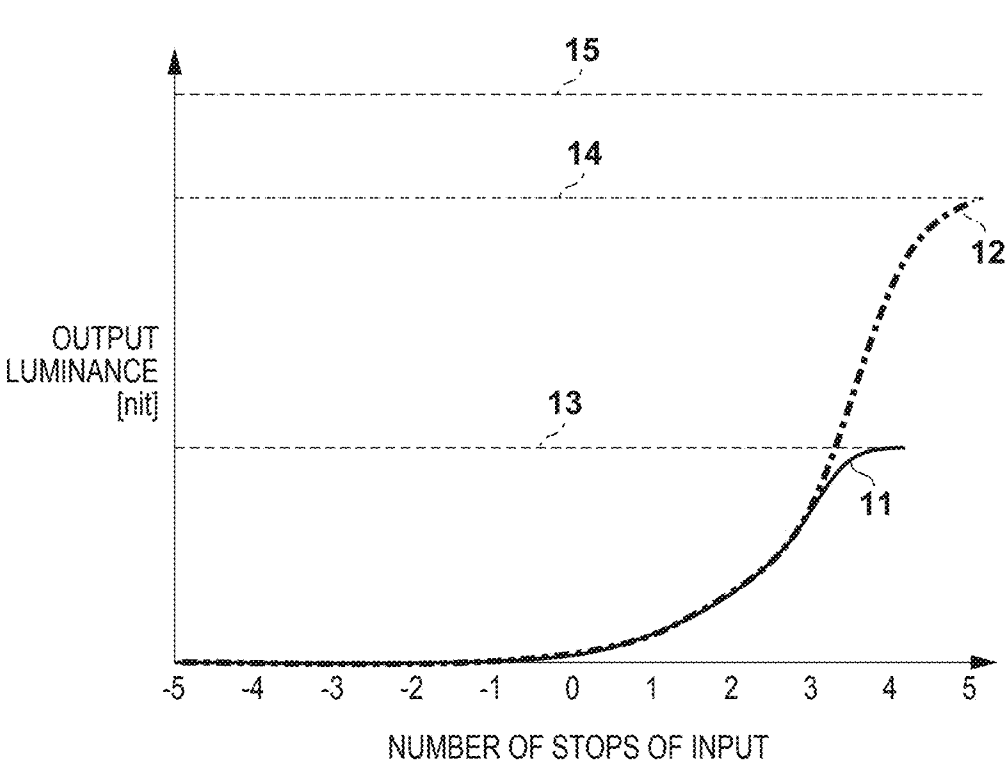
FIG. 1 is a diagram for describing the input/output characteristics associated with two types of image capturing modes with different exposure amounts.
Figure 2:
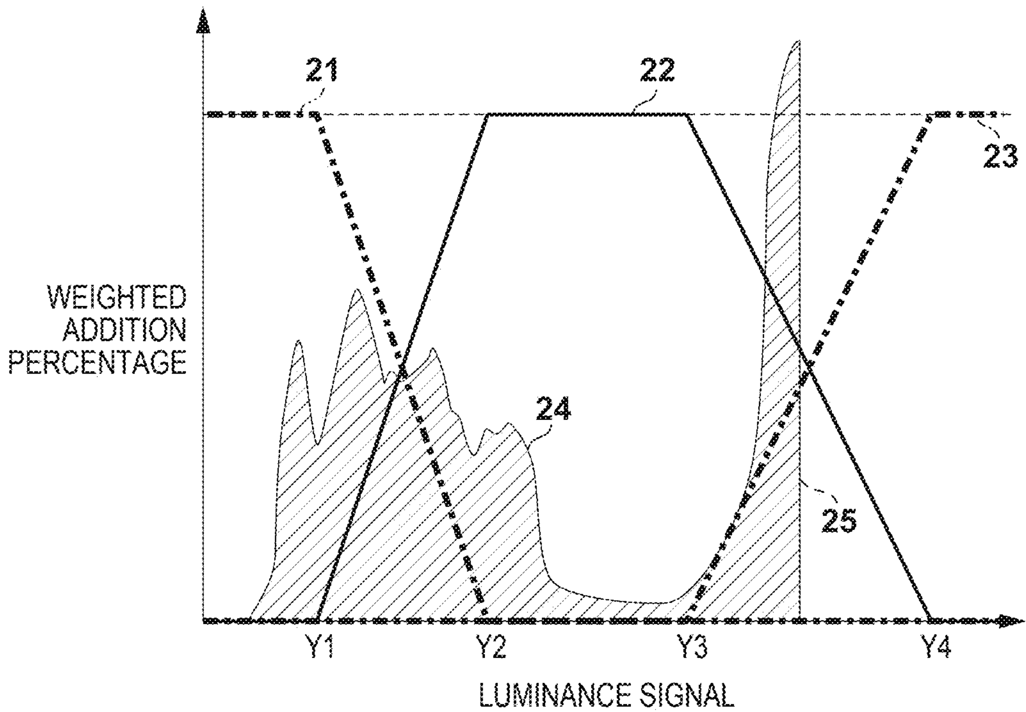
FIG. 2 is a diagram showing a mode in which the weighted addition percentages based on SDR images are applied to composition processing for HDR images.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

The following describes one embodiment in relation to an example in which the present invention is applied to an image processing apparatus that can generate a composite image by compositing HDR images that have been encoded using the PQ method and by further extending the dynamic range, as one example of an image processing apparatus. However, the present invention is applicable to any device that can derive the composition percentages of respective HDR images involved with the generation of this composite image.

Also, the present specification will be described assuming that an "HDR image" is an image to which encoding of the PQ method is applied, and which is configured so that absolute display luminance can be obtained through decoding (PQ signals), unless specifically stated otherwise. Furthermore, an image that is obtained by compositing HDR images and by further extending the dynamic range will be described simply as a "composite image" in order to make a distinction from an HDR composite image obtained by compositing conventional SDR images, and from HDR images that have been input (the sources of composition). In the following description, it is assumed that a composite image is PQ signals, similarly to an HDR image.

Here, the depth of at least 10 bits is required to represent the HDR characteristics using PQ signals, and it is assumed that an HDR image and a composite image are not files that store an 8-bit image like the JPEG format. For example, an HDR image and a composite image may be HEIF files that are stored using a container of the High Efficiency Image File Format (hereinafter referred to as HEIF), which is an image file format developed by the Moving Picture Experts Group (MPEG) and defined by MPEG-H Part 12 (ISO/IEC 23008-12). HEIF allows not only a main image, but also a thumbnail, a plurality of temporally-related images, and metadata such as EXIF and XMP to be stored in one file. Also, as HEIF allows a 10-bit image sequence that has been encoded using HEVC to be stored as well, it can be said that HEIF is suitable for storing of an HDR image and a composite image in the present invention. Note that embodiments of the present invention are not limited to the foregoing, and an HDR image and a composite image may be of any format as long as their format allows storing of image data of 10 bits or larger, such as RAW data and TIFF data after development processing.

«Hardware Configuration of Image Processing Apparatus»

Figure 3:
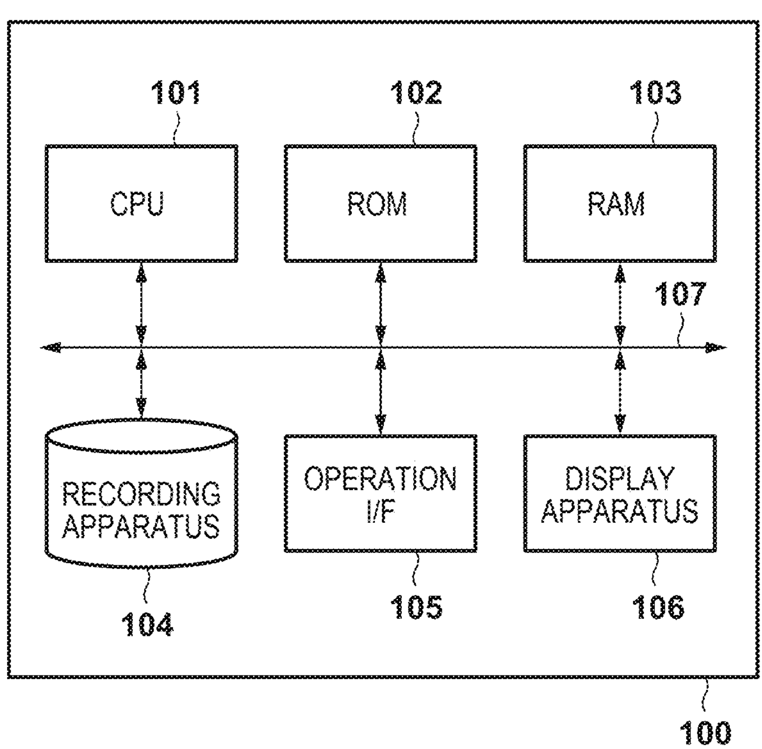
FIG. 3 is a block diagram exemplarily showing a hardware configuration of an image processing apparatus 100 according to embodiments and modifications of the present invention.

FIG. 3 is a block diagram showing a hardware configuration of an image processing apparatus 100 according to the present embodiment. As shown in the figure, the image processing apparatus 100 of the present embodiment includes a CPU 101, a ROM 102, a RAM 103, a recording apparatus 104, an operation I/F 105, a display apparatus 106, and a system bus 107.

The CPU 101 performs overall control on the image processing apparatus 100. The ROM 102 is a storage apparatus that stores a control program necessary for activation of the image processing apparatus 100, such as a BIOS, as well as programs, parameters, and data that need not be changed. The RAM 103 is a storage apparatus that includes a working area for the CPU 101, a primary storage area for temporarily storing various types of data, an area for loading various types of programs, and so forth.

The recording apparatus 104 is a recording apparatus that stores an OS program, various types of control programs, programs of various types of software that can be executed on the OS program, and various types of data such as HDR images used in later-described composition processing, and a composite image obtained as a result of the composition processing. The recording apparatus 104 includes, for example, a hard disk and a flash memory that are built in or attachably/removably connected to the image processing apparatus 100, as well as a flexible disk, an optical disc, a magneto-optical disc, an IC card, a memory card, and the like that are attachably/removably connected thereto. Therefore, the CPU 101 can control the image processing apparatus 100 by deploying various types of programs stored in the ROM 102 or the recording apparatus 104 to the RAM 103 and executing the programs.

The operation I/F 105 is a user interface included in the image processing apparatus 100, and is, for example, a keyboard, a mouse, a touchscreen, and the like. Upon detecting an operational input that has been made by a user, the operation I/F 105 transmits a control signal associated with the pertinent operation to the CPU 101. The display apparatus 106 is, for example, a liquid crystal display, and displays various types of information including graphical user interfaces associated with an OS or software running on the image processing apparatus 100. The system bus 107 allows respective blocks that compose the image processing apparatus 100 to be connected in a communication-enabled manner.

The image processing apparatus 100 may be a dedicated apparatus that develops and edits RAW images that have already been shot; in this case, a program of the composition processing can be stored in the ROM 102. Also, a general-purpose personal computer (PC) can function as the image processing apparatus 100 as the CPU 101 deploys, to the RAM 103, a program of the composition processing stored in the recording apparatus 104. Furthermore, an image capturing apparatus that can obtain RAW images through image capture can also function as the image processing apparatus 100 as its control unit executes a program of the composition processing, or as an image processing unit that executes the composition processing performs prescribed operations.

«Composition Processing»

Next, with reference to the drawings, a description is given of the details of the composition processing which is executed in the image processing apparatus 100 according to the present embodiment, and which generates a composite image by compositing a plurality of HDR images that have been shot with different exposure amounts. The present composition processing is realized by the CPU 101 reading out the program of the composition processing from the ROM 102 or the recording apparatus 104, deploying the program to the RAM 103, and executing the program. FIG. 4 is a diagram exemplarily showing module constituents that are realized during the execution of the composition processing, and FIG. 5 is a diagram exemplarily showing a flowchart for describing the flow of this composition processing.

The following description will be provided assuming that the plurality of HDR images shot with different exposure amounts, which are used as inputs for the composition processing, are all HDR PQ images that have been encoded using the PQ method (hereinafter referred to as PQ images). Also, it is assumed that there are three types of PQ images that are used as inputs in the composition processing of the present embodiment: a proper-exposure PQ image 402 that has been obtained through shooting with proper exposure, an over-exposure PQ image 401 that has been obtained through shooting with overexposure, and an under-exposure PQ image 403 obtained through shooting with underexposure. The over-exposure PQ image 401, the proper-exposure PQ image 402, and the under-exposure PQ image 403 may be images that have been obtained, for the composition of a composite image, by shooting the same scene sequentially in image capturing modes with different exposure settings. Although the present embodiment will be described assuming that shooting with different exposure settings is shooting with different image capturing modes for the sake of convenience, it is to be understood that embodiments of the present invention are not limited by this.

Note that in the present embodiment, it is assumed that exposure information indicating exposure settings of the image capturing apparatus at the time of shooting of the PQ image, as well as information of the Opto-Electronic Transfer Function (OETF) used in encoding of the PQ image, is added as metadata to each of the PQ images that are used as inputs. The exposure information may be, for example, information of the diaphragm, shutter speed, and ISO sensitivity that were set at the time of image capture. The OETF is the product of the Opto-Optical Transfer Function (OOTF) that has been set in advance for each exposure setting or is based on the intention of production of an output image that complies with user settings, and an inverse function of the reference EOTF defined by the ITU-R BT.2100. Furthermore, it is assumed that Maximum Dynamic Range Level (MaxDRL) described in Japanese Patent Laid-Open No. 2020-039118 is added as metadata to each PQ image. MaxDRL is the largest value of PQ signal output values after the corresponding OETF has been applied in development and encoding of image signals that have been shot, and is a peak luminance value (an upper limit value) of a dynamic range that can be represented by each PQ image. Although MaxDRL is described as the peak luminance value in the present embodiment, it may be a value indicating a nit value corresponding to the peak luminance value. MaxDRL is used to find out a dynamic range of an input image when, for example, an HDR image is tone mapped to HDR or SDR signals with a smaller dynamic range. In the present specification, the three types of PQ images that are used as inputs may be input as HEIF files that are different from one another, or may be stored in one HEIF file.

In step S501, the over-exposure PQ image 401, the proper-exposure PQ image 402, and the under-exposure PQ image 403 are read out from the recording apparatus 104 and deployed to the RAM 103. Through processing of the present step, the PQ images used in the composition of a composite image are input.

In step S502, exposure coordination is performed with respect to the three types of PQ images. Here, if the PQ images, which are nonlinear signals, are used as is, the accuracy of exposure coordination can decrease; thus, exposure coordination is performed after the PQ images are linearized. More specifically, exposure coordination for the three types of PQ images is realized by linearization performed by a PQ de-gamma module 404, exposure coordination performed by an exposure coordination module 405, and nonlinearization performed by a PQ gamma module 406.

It is sufficient that linearization in the PQ de-gamma module 404 be performed by referring to information of the OETF that was used in encoding, which is added to each PQ image, and by applying an inverse function thereof (de-gamma).

Also, exposure coordination in the exposure coordination module 405 is performed by applying a gain based on a difference between exposure stops with respect to each of the linearized images. In the present embodiment, it is assumed that proper exposure (exposure used in the obtainment of the proper-exposure PQ image 402) is used as a base in performing exposure coordination, and a linearized image associated with overexposure and a linearized image associated with underexposure are each corrected to have the same exposure as proper exposure by applying gains thereto. For example, in a case where the proper-exposure PQ image 402 has been shot with a diaphragm of F5.6, a shutter speed of 1/60, and an ISO sensitivity of 200, and the under-exposure PQ image 403 has been shot with a diaphragm of F5.6, a shutter speed of 1/500, and an ISO sensitivity of 200, the difference between exposure stops is three stops. Therefore, the exposure coordination module 405 applies a gain increase corresponding to three stops to the image obtained by linearizing the under-exposure PQ image 403, thereby correcting the same so that it has the same exposure as the proper-exposure PQ image 402.

Also, thereafter, the PQ gamma module 406 performs nonlinearization by applying the mutual OETF to each of the images that have been corrected in exposure. As shown in FIG. 6, the OETF applied by the PQ gamma module 406 is the OETF that supports a wider dynamic range (a dash-dot-dash line 603) than the OETF applied to the input PQ image (a solid line 601). As shown in the figure, the OETF applied by the PQ gamma module 406 may support higher luminance 604 so as to obtain a composite image with an extended dynamic range in the composition processing that follows. Here, the OETF applied by the PQ gamma module 406 may also be, for example, provided as a fixed entity in advance, as with an inverse function of the reference EOTF defined by the ITU-R BT.2100. Alternatively, this OETF may be changed adaptively so that the maximum luminance (luminance 604) is set in accordance with an under-exposure PQ image 403'.

The execution of processing of step S502 results in the obtainment of the over-exposure PQ image, the proper-exposure PQ image, and the under-exposure PQ image that have the same exposure. Hereinafter, the PQ images after processing of step S502 will be referred to as an over-exposure PQ image 401', a proper-exposure PQ image 402', and an under-exposure PQ image 403', respectively, for the sake of convenience. Here, the over-exposure PQ image 401' is an image that includes a smaller amount of noise in a dark portion than the proper-exposure PQ image 402', and the under-exposure PQ image 403' is an image that includes fewer blown-out highlights and more tones in a bright portion than the proper-exposure PQ image 402'.

In step S503, a displacement correction module 407 detects positional displacements between the over-exposure PQ image 401' and the proper-exposure PQ image 402', and between the under-exposure PQ image 403' and the proper-exposure PQ image 402', and performs processing for correcting the positional displacements in a case where the positional displacements have occurred. Any of known methods may be used in the detection and correction of the positional displacements. For example, division into blocks and edge extraction may be performed, and a motion vector that corresponds to the smallest sum of absolute differences (SAD) of pixel values is derived on a per-block basis. Then, the positional displacement correction may be performed by applying the affine transformation to the images to be corrected with use of an affine coefficient that has been obtained based on such motion vectors. In a case where the proper-exposure PQ image 402' is used as a base in performing the positional displacement correction, it is sufficient to apply the affine transformation to other images, namely the over-exposure PQ image 401' and the under-exposure PQ image 403'. Note that although the present embodiment will be described assuming that the positional displacements are detected and corrected after processing of step S502 because the detection accuracy is increased by reducing the brightness difference among the images, they bear no dependency relationship, and therefore it is to be understood that the processing order may be changed.

In step S504, a percentage changing module 408 decides on the composition percentages (weighted addition percentages, weighted addition coefficients) of respective images. In the present embodiment, the weighted addition percentages of respective images are decided on by configuring a changed Mix table for changing a base Mix table 409 shown in FIG. 7A, and referring to this changed Mix table. As shown in the figure, the base Mix table 409 exhibits a distribution in which the weighted addition percentages of the over-exposure PQ image 401', the proper-exposure PQ image 402', and the under-exposure PQ image 403' vary depending on a luminance value, similarly to Japanese Patent Laid-Open No. 2013-240031. With regard to display luminance ranges of the PQ method (corresponding to an upper limit of 10,000 nits), the base Mix table 409 includes an over-exposure image percentage 701 (a dash-dot-dot-dash line), a proper-exposure image percentage 702 (a solid line), and an under-exposure image percentage 703 (a dash-dot-dash line), which indicate the weighted addition percentages of respective images. Here, the weighted addition percentages of respective images in the base Mix table 409 are configured so that they altogether constitute 1 (100%) at each luminance value. Therefore, the luminance ranges are divided into a value range in which only the over-exposure PQ image 401' is used, a value range in which the over-exposure PQ image 401' and the proper-exposure PQ image 402' are composited, a value range in which the proper-exposure PQ image 402' is used, a value range in which the proper-exposure PQ image 402' and the under-exposure PQ image 403' are composited, and a value range in which only the under-exposure PQ image 403' is used. The division into these value ranges is defined based on base points (luminance thresholds) which have been set for respective images and at which the composition tendency is switched.

The percentage changing module 408 reads out the base Mix table 409 from, for example, the ROM 102 or the recording apparatus 104, and subsequently obtains exposure information and MaxDRL that have been added to each of the over-exposure PQ image 401, the proper-exposure PQ image 402, and the under-exposure PQ image 403. Then, the percentage changing module 408 changes the predetermined luminance thresholds provided in the base Mix table 409 based on the obtained exposure information and MaxDRL, thereby configuring a table indicating the weighted addition percentages with which the composition result of a composition module 410 in a later stage becomes favorable. In the present embodiment, a luminance threshold 704 and a luminance threshold 705 at which the weighted addition percentages of the over-exposure PQ image 401' and the proper-exposure PQ image 402' become 0%, respectively, are provided as the predetermined luminance thresholds, and these luminance thresholds may be changed.

As stated earlier, there is a possibility that the luminance range in which the over-exposure PQ image 401' and the proper-exposure PQ image 402' are composited, as well as the luminance range in which the proper-exposure PQ image 402' and the under-exposure PQ image 403' are composited, does not appear as signals with appropriate luminance values in an image shot with a high exposure amount. That is to say, if a weighted addition percentage higher than 0% is applied to one image, or if a weighted addition percentage lower than 100% is applied to another image, even though one image does not include the pertinent luminance range, there is a possibility that a favorable composition result is produced. Therefore, the percentage changing module 408 of the present embodiment changes each of the luminance threshold 704 and the luminance threshold 705 to a value that does not exceed the maximum display luminance that can be represented in the corresponding image.

Here, as the proper-exposure PQ image 402 is used as a base in adjusting the exposures of the over-exposure PQ image 401 and the under-exposure PQ image 403 in the present embodiment, the maximum display luminance associated with the proper-exposure PQ image 402' is MaxDRL of the proper-exposure PQ image 402. On the other hand, as the maximum display luminance associated with the over-exposure PQ image 401' is different from MaxDRL of the over-exposure PQ image 401 due to the exposure coordination in step S502, the percentage changing module 408 derives the same using the following expression.

$$\text{Maximum display luminance for over-exposure} = \text{OETF}(\text{EOTF}(\text{MaxDRL of over-exposure}) \times 2^{(\textit{the difference between exposure stops of over-exposure and proper-exposure})})$$

That is to say, similarly to step S502, the percentage changing module 408 performs linearization by applying the EOTF (OETF-1) to MaxDRL of the over-exposure PQ image 401, and applies a gain associated with the different between the exposure stops of the over-exposure PQ image 401 and the proper-exposure PQ image 402. Thereafter, the percentage changing module 408 performs nonlinearization by applying the OETF to the obtained value, thereby deriving the maximum display luminance associated with the over-exposure PQ image 401'.

Figure 7A:
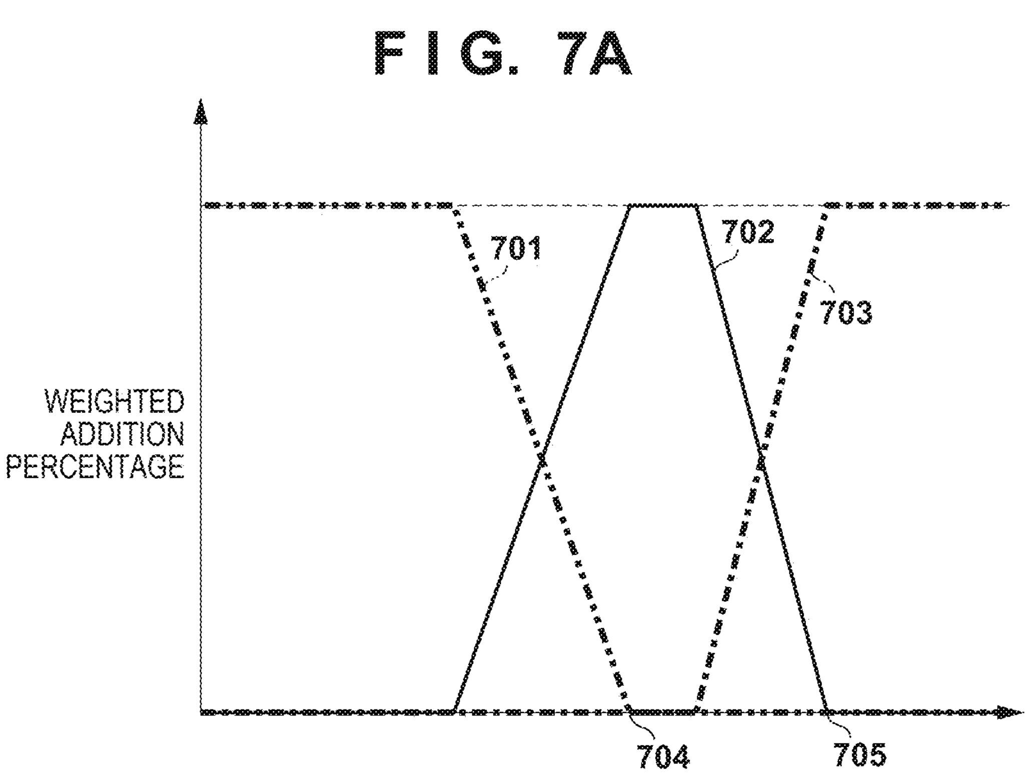
FIGS. 7A and 7B are diagrams for describing a base Mix table and a changed Mix table according to the embodiments of the present invention.
Figure 7B:
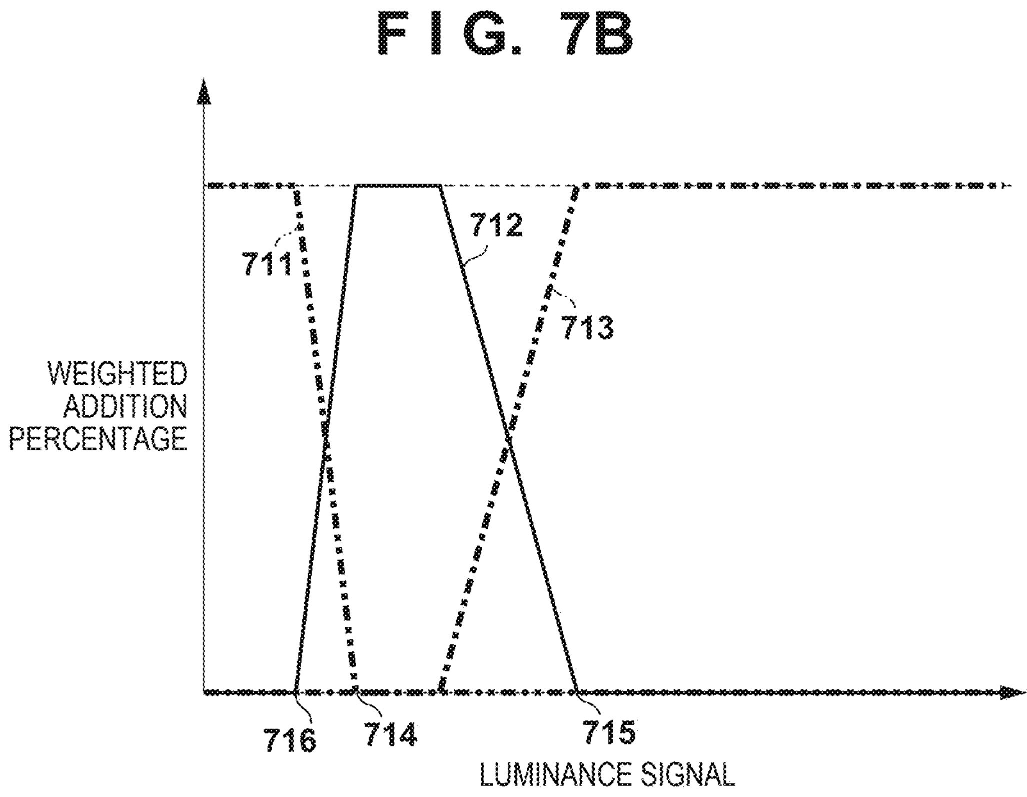

Therefore, the percentage changing module 408 changes each of the luminance threshold 704 and the luminance threshold 705 to the maximum display luminance associated with the over-exposure PQ image 401' or the proper-exposure PQ image 402' that has been obtained in the foregoing manner, and obtains a new changed Mix table shown in FIG. 7B. More specifically, the percentage changing module 408 obtains a post-change over-exposure image percentage 711 by linear scaling the over-exposure image percentage 701 so that the luminance threshold 704 turns into a luminance threshold 714 (the maximum display luminance associated with the over-exposure PQ image 401'). The percentage changing module 408 obtains a post-change proper-exposure image percentage 712 by linear scaling the proper-exposure image percentage 702 so that the luminance threshold 705 turns into a luminance threshold 715 (the maximum display luminance associated with the proper-exposure PQ image 402'). Furthermore, the percentage changing module 408 obtains a post-change under-exposure image percentage 713 by linear scaling the under-exposure image percentage 703, too, at the rate similar to the rate for the proper-exposure image percentage 712.

Note that at this time, as the rate of applied scaling can vary between the over-exposure image percentage 711 and the proper-exposure image percentage 712, the over-exposure image percentage 711 may be used as a base in determining a luminance range in which the over-exposure PQ image 401' and the proper-exposure PQ image 402' are composited. That is to say, it is sufficient that the luminance range associated with the proper-exposure image percentage 712 be changed so that the weighted addition percentage of the proper-exposure PQ image 402' is 100% at the luminance threshold 714. Also, it is sufficient that this luminance range be changed so that the weighted addition percentage of the proper-exposure PQ image 402' starts increasing from 0% at a luminance value 716 at which the weighted addition percentage corresponding to the over-exposure image percentage 711 starts decreasing. That is to say, it is sufficient to configure the changed Mix table by making an adjustment especially based on an image with higher exposure so that the total of the weighted addition percentages of images to be composited is 100% at any luminance value.

In step S505, the composition module 410 generates a composite image by performing luminance-by-luminance composition processing with use of the over-exposure PQ image 401', the proper-exposure PQ image 402', and the under-exposure PQ image 403' after the positioning based on the changed Mix table configured in step S504. That is to say, with regard to a dark portion region (a luminance range in which the over-exposure image percentage 711 is 100%), the composition module 410 stores pixel values of the over-exposure PQ image 401' at the positions therein after the positioning. Also, with regard to a halftone region (a luminance range in which the proper-exposure image percentage 712 is 100%), the composition module 410 stores pixel values of the proper-exposure PQ image 402' at the positions therein. Also, with regard to a bright portion region (a luminance range in which the under-exposure image percentage 713 is 100%), the composition module 410 stores pixel values of the under-exposure PQ image 403' at the positions therein. Also, with regard to a region between a dark portion and halftone, the composition module 410 derives pixel values by adding the results of multiplying pixel values of the proper-exposure PQ image 402' and the over-exposure PQ image 401' after the positioning at the positions therein by their respective weighted addition coefficients, and stores the derived pixel values. Also, with regard to a region between halftone and a bright portion, the composition module 410 derives pixel values by adding the results of multiplying pixel values of the proper-exposure PQ image 402' and the under-exposure PQ image 403' after the positioning at the positions therein by their respective weighted addition coefficients, and stores the derived pixel values. This makes it possible to obtain a composite image which gives a smooth representation of luminance ranges that include an image changeover, and which represents a scene in a favorable mode, from a dark portion to a bright portion.

Note that the generated composite image may be, for example, regarded as a new PQ image, and stored into the recording apparatus 104 as an image file of the HEIF format. An image file of the HEIF format has a file structure shown in FIG. 8A. That is to say, a file of the HEIF format is composed of an ftyp box 801 indicating a file format, a meta box 802 that stores metadata including a thumbnail image 811, and an mdat box 803 that stores encoded data (a main image 812). Therefore, the composition module 410 generates a file by storing data obtained by encoding the generated composite image based on the PQ method into the mdat box 803, and storing a thumbnail image of the composite image and MaxDRL associated with the composite image into the meta box 802.

Here, MaxDRL associated with the composite image may be, for example, the maximum display luminance associated with the under-exposure PQ image 403'. That is to say, as the upper limit of the dynamic range of the composite image is determined mainly based on the under-exposure PQ image 403 that has been composited with a gain increase, the composition module 410 may derive information of this maximum display luminance with use of the following expression and use the derived information as MaxDRL.

$$\text{Maximum display luminance for composition} = OETF\left(EOTF\left(MaxDRL \text{ of under-exposure}\right) \times 2^{(proper\text{-}exposure - over\text{-}exposure)}\right)$$

That is to say, MaxDRL of the under-exposure PQ image 403 is converted into a linearized value by applying the inverse characteristics of the OETF used in encoding, and this value is nonlinearized by applying the mutual OETF with a gain increase; the resultant value is stored as MaxDRL of the composite image.

Alternatively, MaxDRL need not be determined based on MaxDRL of images; for example, it is permissible to store information of MaxDRL in advance in connection with the image capturing modes that were used in obtaining input PQ images as shown in FIG. 9, and to adopt a corresponding value. For example, in a case where three PQ images that were shot in an image capturing mode corresponding to +3 stops, which is a normal mode, are input, the composition module 410 can decide on 888 (2,906 nits) as MaxDRL of a composite image based on information (maximum-signal PQ code values) stored in the recording apparatus 104. This can place an output composite image in the form of a file that can easily be used.

Second Embodiment

Although the above embodiment has been described in relation to a mode in which input HDR images to which composition processing is to be applied are PQ images, embodiments of the present invention are not limited by this. That is to say, it is sufficient that an input image be an HDR image that represents scene luminance based on a method different from a method that allocates fixed value ranges irrespective of exposure conditions as in an SDR image, and an input image may be, for example, a RAW image (12 to 14 bits) that is higher in resolution than a PQ image (10 bits). In this case, it is sufficient to realize composition processing with, for example, module constituents shown in FIG. 10 by using, as inputs, a plurality of RAW images that have been obtained by performing shooting with different exposure amounts. Here, it is assumed that there are three types of input RAW images: a proper-exposure RAW image 1002 that has been obtained through shooting with proper exposure, an over-exposure RAW image 1001 that has been obtained through shooting with overexposure, and an under-exposure RAW image 1003 that has been obtained through shooting with underexposure. Also, regarding FIG. 9, the constituents that are the same as the module constituents associated with the composition processing of the first embodiment are given the same reference signs thereas, and a detailed description thereof will be omitted below.

Composition processing of the present embodiment includes conversion of three types of input, pre-development RAW images into PQ images with use of a development processing module 1004 (development processing). The development processing executed by the development processing module 1004 is segmentalized into types of processing performed by function modules shown in FIG. 11. Specifically, a white balance module 1101 executes white balance processing, which causes white to become white, with respect to the input RAW images so as to apply gains that cause R, G, and B in a region that is supposed to be white to have the same signal value to R, G, and B, respectively. Then, a noise reduction module 1102 applies, to the input images, noise reduction processing that reduces, for example, sensor-cased noise that does not originate from a subject image. Then, a color interpolation module 1103 applies color interpolation processing to the input color mosaic images so as to generate color images that have complete color information of R, G, and B with respect to all pixels. A matrix conversion module 1104 and a gamma conversion module 1105 apply matrix conversion processing and gamma conversion processing, respectively, to the generated color images; as a result, basic color images are generated. Here, the gamma conversion processing performed by the gamma conversion module 1105 uses, for example, OETFs which have been added to respective RAW images and which correspond to image capturing modes. Thereafter, a color adjustment module 1106 applies, for example, image correction processing for improving the image appearance, such as saturation enhancement, hue correction, and edge enhancement, to the color image, and outputs PQ images.

As described above, even in a mode in which linear RAW images are input, converting them into PQ images by applying the OETFs thereto makes it possible to generate a favorable composite image similarly with use of the function modules associated with the composition processing of the first embodiment.

Note that although the present embodiment has been described in relation to a mode in which the function modules associated with the composition processing of the first embodiment are utilized so that the use thereof can be shared with the composition processing of the first embodiment, it is to be easily understood that embodiments of the present invention are not limited by this. That is to say, as information of luminance ranges in each image, which is associated with the decision of composition percentages, is obtained through exposure coordination for linearized images, the development processing of the development processing module 1004 and the linearization processing of the PQ de-gamma module 404 need not be performed.

First Modification

The above embodiments have been described in relation to a mode in which, with regard to HDR images that are input for composition processing, the OETF that was/is used in development and encoding can be obtained.

Meanwhile, as inclusion of information of the OETF (or information of the EOTF corresponding to the inverse characteristics thereof) in an image file as metadata can cause an increase in the file size, there are cases where such information is not included. In these cases, the reference EOTF defined by the ITU-R BT.2100, although possibly reduced in accuracy, may be used as the inverse function of the OETF used in linearization performed by the PQ de-gamma module 404. Also, at this time, the inverse function of the reference EOTF may be used in nonlinearization performed by the PQ gamma module 406.

Second Modification

The above embodiments and modification have been described assuming that HDR images that are input for composition processing are obtained through shooting with different exposure amounts, and the peak luminance values in a dynamic range are distributed in such a manner that the magnitude relationship thereof is in conformity with the composition processing. That is to say, the description has been provided assuming that the weighted addition percentages that enable input images to be favorably composited are derived by scaling the base Mix table 409 based on MaxDRLs of the HDR images that have undergone exposure coordination.

However, in a case where, for example, the luminance conversion characteristics of the input HDR images have been changed (MaxDRLs have changed) due to retouching that has been applied after shooting, there is a possibility that luminance ranges in which two types of images are composited are restricted, and switching between images cannot be smoothly represented. That is to say, if a luminance range allocated to the switching is extremely small, then a weighted addition percentage changes sharply in this luminance range, and there is a possibility that the generated composite image includes an unnatural representation (hereinafter referred to as unevenness attributed to switching).

Also, for example, in a case where the OETF cannot be obtained with respect to input HDR images as in the first modification, and in a case where retouching for causing the luminance conversion characteristics to be different (causing the EOTF required for linearization to change) has been applied, linearization and exposure coordination could possibly be insufficient. That is to say, as appropriate luminance cannot be allocated with respect to subjects in the vicinity of saturated luminance in each HDR image, there is a possibility that color curving and the like occur in the composite image.

The present modification will be described, with reference to the drawings, in relation to a method of generating a changed Mix table associated with the decision of weighted addition percentages of respective HDR images so as to prevent the occurrence of the above-mentioned unevenness attributed to switching and color curving in the composite image, with reference to the drawings. That is to say, the present modification will be described in relation to a mode that allows weighted addition percentages of respective images to be favorably set in accordance with not only MaxDRLs of input HDR images, but also a combination thereof.

Figure 12:
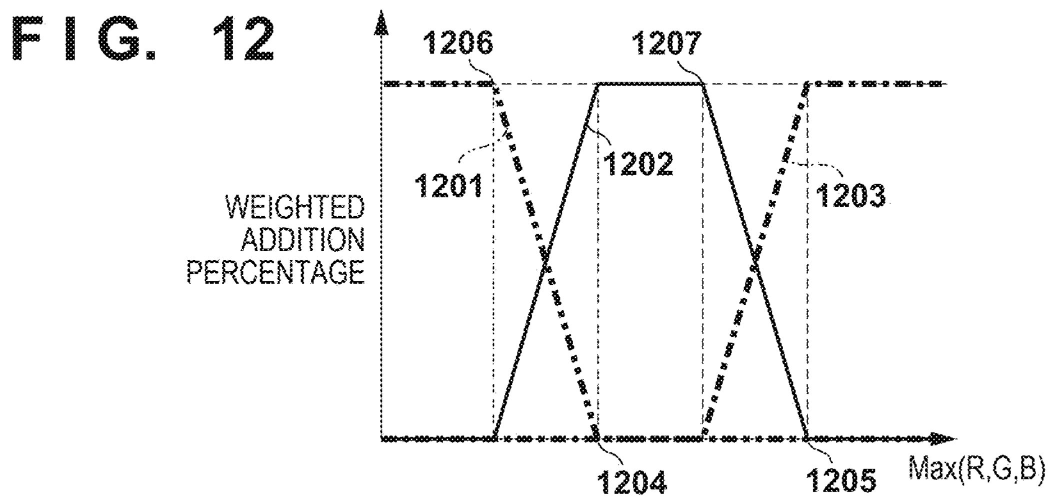
FIG. 12 is a diagram for describing a base Mix table according to a second modification of the present invention.

In the present embodiment, unlike the above-described embodiments, it is assumed that a base Mix table shown in FIG. 12 is provided with respect to Max (R, G, B), which is the maximum value of R, G, or B color signals of reference pixels of an input image. In the base Mix table of FIG. 12, a dash-dot-dot-dash line 1201, a solid line 1202, and a dash-dot-dash line 1203 respectively indicate the weighted addition percentages of an over-exposure HDR image, a proper-exposure HDR image, and an under-exposure HDR image, similarly to the base Mix table 409 shown in FIG. 7A. The difference from the base Mix table 409 shown in FIG. 7A is that the base Mix table of FIG. 12 is defined with respect to the maximum signal value (Max (R, G, B)) of R, G, and B, rather than luminance values. Below, for the sake of simple description, a signal threshold 1206 at which the weighted addition percentage of the over-exposure HDR image starts decreasing from 100% and at which the weighted addition percentage of the proper-exposure HDR image starts increasing from 0%, or a threshold corresponding thereto, may be referred to as $Over_{1End}$. Also, a signal threshold 1204 at which the weighted addition percentage of the over-exposure HDR image reaches 0% and at which the weighted addition percentage of the proper-exposure HDR image reaches 100%, or a threshold corresponding thereto, may be referred to as $Prop_{1Start}$. Also, a signal threshold 1207 at which the weighted addition percentage of the proper-exposure HDR image starts decreasing from 100% and at which the weighted addition percentage of the under-exposure HDR image starts increasing from 0%, or a threshold corresponding thereto, may be referred to as $Prop_{1End}$. Also, a signal threshold 1205 at which the weighted addition percentage of the proper-exposure HDR image reaches 0% and at which the weighted addition percentage of the under-exposure HDR image reaches 100%, or a threshold corresponding thereto, may be referred to as $Under_{1Start}$. The percentage changing module 408 of the present modification configures a changed Mix table for composition processing in the composition module 410 by adjusting these designated signal thresholds 1204 to 1207.

«Overview of Configuration of Changed Mix Table»

A description is now given of an overview of the configuration of the changed Mix table that determines weighted addition percentages of respective HDR image with use of the base Mix table in the present modification.

The above-described color curving occurs mainly due to nonlinear conversion in the vicinity of a saturated luminance value (a change in the extent to which an output curve lies), as shown in FIG. 6. Therefore, in a case where the conversion characteristics that were applied at the time of development or the conversion characteristics that have taken retouching into consideration cannot be obtained, linearization of luminance values of input HDR images cannot be accurately performed, and consistency between images cannot be guaranteed in composition in the pertinent value range. On the other hand, there is a high possibility that linear conversion has been performed, excluding the vicinity of saturated luminance values. Therefore, the percentage changing module 408 of the present modification sets the number of stops that has a possibility of causing nonlinear conversion (the number of stops that prevents composition) as a constant, and derives the maximum display luminance value (conversion MaxDRL) with respect to the over-exposure HDR image and the proper-exposure HDR image in view of this number of stops that prevents composition. More specifically, the percentage changing module 408 derives conversion MaxDRL by subtracting the value of the number of stops that prevents composition from a linearized value obtained by, for example, applying the reference EOTF to MaxDRL of an input image, and changes the base Mix table based on the conversion MaxDRL.

Also, the above-described unevenness attributed to switching can occur as a result of restriction on the signal range defined by the signal threshold 1206 and the signal threshold 1204, and the signal range defined by the signal threshold 1207 and the signal threshold 1205. The signal ranges are restricted especially in a case where the base Mix table is changed using conversion MaxDRL that has been set so as to exclude the luminance ranges in the vicinity of saturated luminance, similarly to the present modification. With regard to the under-exposure HDR image, as there is sufficient room before a saturated signal value is reached, the percentage changing module 408 of the present modification allocates the weighted addition percentages of the over-exposure HDR image and the proper-exposure HDR image based on the signal value corresponding to conversion MaxDRL of the proper-exposure HDR image. Therefore, the value range from the signal value 0 to the signal value corresponding to conversion MaxDRL of the proper-exposure HDR image includes the following two types of value ranges. One is the value range in which the weighted addition percentage of the over-exposure HDR image is 100%, and the value range in which the weighted addition percentage of the over-exposure HDR image is 0% to 100% (hereinafter referred to as a used range of over-exposure). The other is the value range in which the weighted addition percentage of the proper-exposure HDR image is 100%, and the value range in which the weighted addition percentage of the proper-exposure HDR image is 0% to 100% (hereinafter referred to as a used range of proper-exposure). In the present modification, with regard to the used range of over-exposure and the used range of proper-exposure, a threshold W is provided for the width of the signal range that should be secured to perform smooth composition, and the changed Mix table is configured by adjusting respective signal thresholds so that at least the used range of proper-exposure has a value range width corresponding to the threshold W.

As processing performed by the percentage changing module 408, first, conversion MaxDRL is derived with respect to the over-exposure HDR image and the proper-exposure HDR image with use of the following expression.

$$\text{Conversion } MaxDRL = OETF\left(EOTF\ (\text{target } MaxDRL) \times 2^{(proper-exposure\ -\ target\ exposure\ -\ the\ number\ of\ stops\ that\ prevents\ composition)}\right)$$

Specifically, the linearized value obtained by applying, for example, the reference EOTF to MaxDRL of each image is nonlinearized by applying the mutual OETF with a gain decrease corresponding to the difference from proper exposure and the number of stops that prevents composition; as a result, conversion MaxDRL of each image is derived. That is to say, the percentage changing module 408 obtains conversion MaxDRL that excludes the vicinity of saturated luminance through a gain decrease corresponding to the number of stops that prevents composition, so as to prevent inconsistency that occurs due to the difference between the inverse characteristics of the OETF used at the time of development of an input image and the characteristics of the EOTF applied in linearization.

Then, the percentage changing module 408 derives each signal threshold for the changed Mix table by scaling each signal threshold of the base Mix table based on conversion MaxDRLs that have been obtained respectively for the over-exposure HDR image and the proper-exposure HDR image. More specifically, the percentage changing module 408 normalizes the value range from the signal value 0 to the signal threshold 1204 of the base Mix table, and multiplies the result of the normalization by a signal value corresponding to conversion MaxDRL of the over-exposure HDR image. As a result, $Over_{1End}$ (corresponding to the signal threshold 1206) and $Prop_{1Start}$ (corresponding to the signal threshold 1204) based on conversion MaxDRL is obtained with respect to the over-exposure HDR image. Also, the percentage changing module 408 normalizes the value range from the signal value 0 to the signal threshold 1205 of the base Mix table, and multiplies the result of the normalization by a signal value corresponding to conversion MaxDRL of the proper-exposure HDR image. As a result, $Prop_{1End}$ (corresponding to the signal threshold 1207) and $Under_{1Start}$ (corresponding to the signal threshold 1205) based on conversion MaxDRL is obtained with respect to the proper-exposure HDR image.

There is no need to adjust the four types of signal thresholds ($Over_{1End}$, $Prop_{1Start}$, $Prop_{1End}$, and $Under_{1Start}$)

that have been obtained based on conversion MaxDRLs of respective images in the foregoing manner, as long as the used range of over-exposure and the used range of proper-exposure have a value range width corresponding to the threshold W. That is to say, even when the changed Mix table is configured based on these four types of signal thresholds, a composite image that prevents the occurrence of unevenness attributed to switching can be obtained. On the other hand, if the used ranges do not satisfy the condition regarding the value range width, unevenness attributed to switching could possibly occur, and thus the percentage changing module 408, for example, determines whether an adjustment is necessary and makes the adjustment with use of these four types of signal thresholds in the following manner.

Figure 13A:
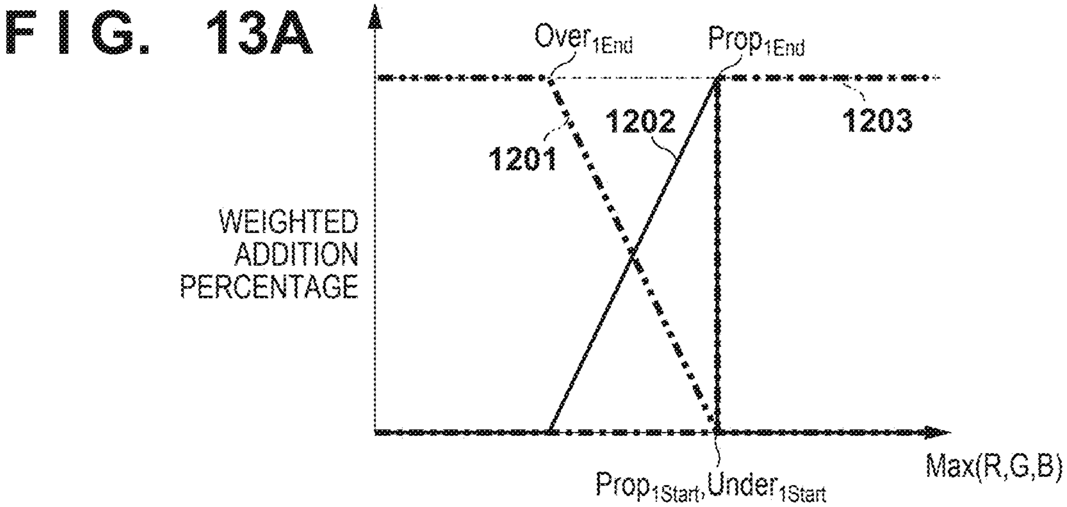
FIGS. 13A and 13B are diagrams for describing a changed Mix table according to the second modification of the present invention.
Figure 13B:
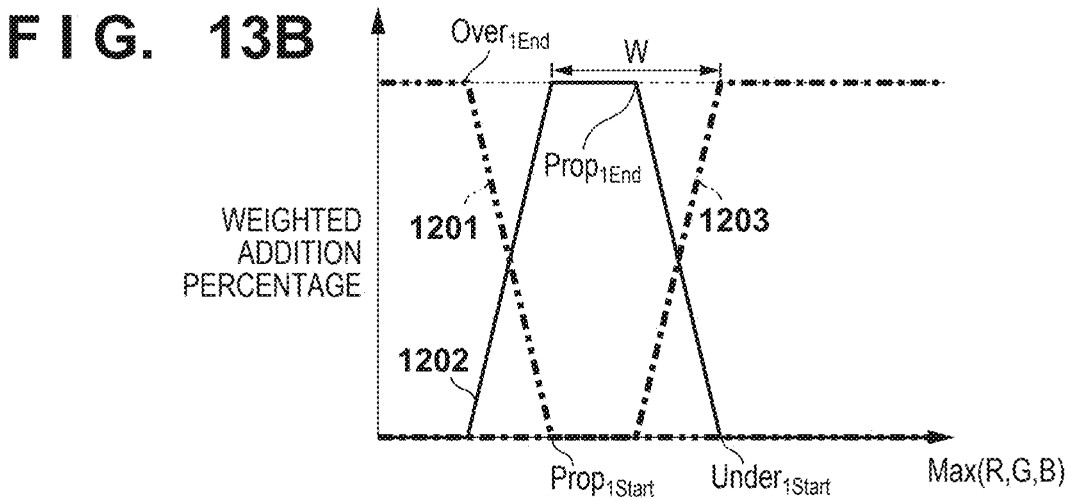

As an extreme example, assume a case where $Prop_{1Start}$ and $Under_{1Start}$ are the same. In this case, if the percentage changing module 408 simply configures a changed Mix table, a changed Mix table shown in FIG. 13A is obtained. According to this changed Mix table, especially the value range in which the proper-exposure HDR image and the under-exposure HDR image are composited ($Prop_{1End}$ to $Under_{1Start}$) cannot be sufficiently secured, and unevenness attributed to switching could possibly occur. In order to prevent such a situation, the percentage changing module 408 of the present modification adjusts $Prop_{1Start}$ so that the used range of proper-exposure has a value range width corresponding to the threshold W as shown in FIG. 13B. That is to say, the used range of proper-exposure is secured by changing $Prop_{1Start}$ to a value obtained by subtracting the threshold W from the signal value corresponding to conversion MaxDRL of the proper-exposure HDR image ($Under_{1Start}$). As a result, the value range in which the proper-exposure HDR image and the under-exposure HDR image are composited is secured, and the occurrence of unevenness attributed to switching is prevented.

Figures 14A, 14B, 14C:
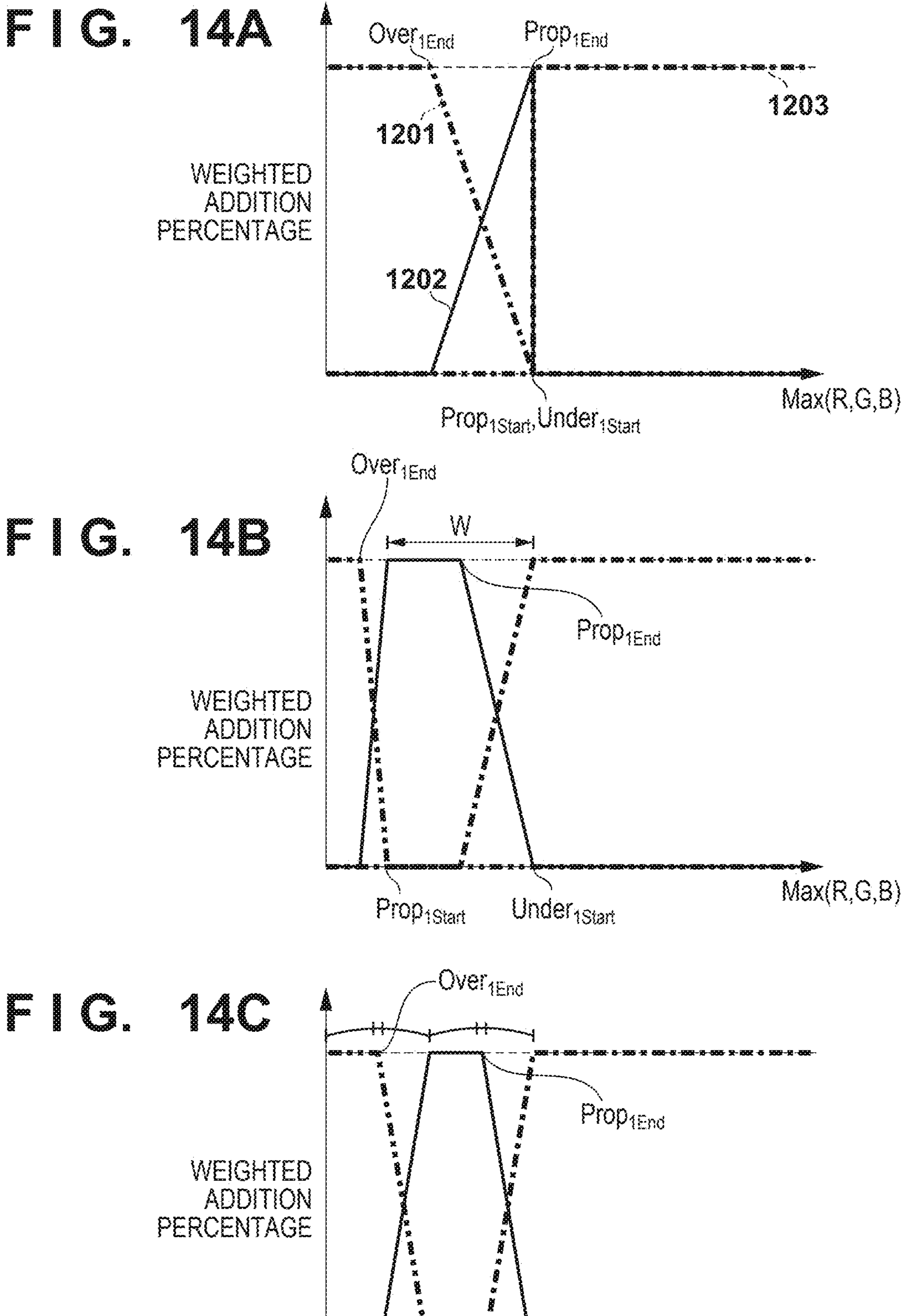
FIGS. 14A, 14B, and 14C are other diagrams for describing a changed Mix table according to the second modification of the present invention.

On the other hand, securing the used range of proper-exposure preferentially may restrict the used range of over-exposure. In a case where $Under_{1Start}$ exceeds two times the threshold W in the mode of FIG. 13A, the value ranges with the threshold W can be secured for the used range of proper-exposure and the used range of over-exposure even if the adjustment is made as shown in FIG. 13B. However, in a case where $Under_{1Start}$ is not more than two times the threshold W as shown in FIG. 14A, securing the value range with the threshold W with respect to the used range of proper-exposure could possibly restrict the used range of over-exposure (FIG. 14B). More specifically, in a case where $Under_{1Start}$ is not more than two times the threshold W and $Prop_{1Start}$ is not less than ½ of $Under_{1Start}$, the used range of over-exposure is restricted by adjusting the used range of proper-exposure so that it has a width of the threshold W. As a result, the value range in which the over-exposure HDR image and the proper-exposure HDR image are composited is not secured, and unevenness attributed to switching could possibly occur. Therefore, in this case, the percentage changing module 408 makes an adjustment so as to, for example, equally divide the value range from the signal value 0 to $Under_{1Start}$ as shown in FIG. 14C so as to prevent the occurrence of unevenness attributed to switching in the used range of over-exposure and the used range of proper-exposure as much as possible. Specifically, the percentage changing module 408 adjusts $Prop_{1Start}$ so that its value is ½ of $Under_{1Start}$.

In other words, the percentage changing module 408 of the present modification derives four types of signal thresholds based on conversion MaxDRLs of the over-exposure HDR image and the proper-exposure HDR image, and then configures the changed Mix table as follows.

(1) Configure the changed Mix table by adjusting $Prop_{1Start}$ so that the used range of proper-exposure conforms to the threshold W in a case where $Under_{1Start}>$the threshold W×2 and $Under_{1Start}-Prop_{1Start}<$the threshold W are both satisfied (FIG. 13B).

(2) Configure the changed Mix table by adjusting each signal threshold so that the used range of over-exposure and the used range of proper-exposure have an equal width in a case where $Under_{1Start}\leq$the threshold W×2 and $Prop_{1Start}\geq Under_{1Start}\times½$ are both satisfied (FIG. 14C).

(3) Configure the changed Mix table without adjusting each signal value range in other cases.

Note, it is assumed that in configuring the changed Mix table, the percentage changing module 408 adjusts $Over_{1End}$ and $Prop_{1End}$ so as to maintain the relative relationships among respective signal thresholds in the base Mix table. This makes it possible to configure the changed Mix table in which the width of the threshold W or an equal width is secured with respect to each of the signal ranges in which the same set of HDR images is composited.

Using the weighted addition percentages according to the changed Mix table configured in the foregoing manner allows the composition module 410 to generate a composite image in which the occurrence of unevenness attributed to switching and color curving has been reduced. Note that although the present modification has been described assuming that the signal thresholds are adjusted and the changed Mix table is configured by providing the threshold W for each of the used ranges, embodiments of the present invention are not limited by this. For example, in a case where the changes in the weighted addition percentages are linearly set for signal ranges in which HDR images are composited, the adjustment and the configuration of the changed Mix table may be performed based on thresholds that have been provided with respect to the inclinations of the linear functions (the rates of the changes in the weighted addition percentages).

As described in the above embodiments and modifications, the image processing apparatus according to the present invention makes it possible to decide on favorable composition percentages in relation to the generation of a composite image which is based on HDR images and which has a further-extended dynamic range.

Note that although the present specification has been described assuming that the input for composition processing is three types of HDR images that have been shot with different exposure amounts, it goes without saying that embodiments of the present invention are not limited by this, and are applicable to composition processing that involves a plurality of arbitrary HDR images. Also, in the generation of a composite image, the maximum number of HDR images that are composited in relation to one signal range is not limited to two types, and the maximum number may be two or more as long as the sum of the weighted addition percentages is not more than 100%.

Also, although the present specification has been described in relation to a mode in which the changed Mix table is configured by changing the base Mix table so as to allow the obtainment of the weighted addition percentages of respective HDR images, embodiments of the present invention are not limited by this. That is to say, in embodying the present invention, the weighted addition percentages of respective HDR images need not be defined by a mode of a table, and may be defined by, for example, a function that derives the weighted addition percentages by performing calculation as necessary.

Also, the present specification has been described assuming that, as a composite image is generated by compositing HDR images based on the PQ method, the PQ gamma module 406 performs nonlinearization by applying the same gamma pertaining to this method. However, it is to be understood that this nonlinearization is not indispensable in deciding on the weighted addition percentages. That is to say, it is sufficient that the weighted addition percentages of respective HDR images be determined in accordance with the format of HDR images that are composited in composition processing, or the format of a composite image to be generated.

Also, it is sufficient that the file format of a composite image to be output through the execution of composition processing allow at least concurrent storing of the upper limit value of the dynamic range associated with this composite image; for example, the MP4 format shown in FIG. 8B may be adopted. In this case, it is sufficient that the upper limit value be stored in meta data 822 inside an mdat box 821.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-148905, filed Sep. 13, 2021, which is hereby incorporated by reference herein in its entirety.

What is claimed is:

1. An image processing apparatus that composites a plurality of images that have been captured with different exposure amounts, the image processing apparatus comprising at least one processor and/or circuit configured to function as following units:

a specification unit configured to specify a signal value indicating an upper limit value of an output dynamic range with respect to at least one of the plurality of images;

a decision unit configured to decide on composition percentages of the plurality of images based on the signal value specified by the specification unit;

an obtaining unit configured to obtain signal thresholds that are used as a base in switching tendencies of the composition percentages of the respective plurality of images, wherein the decision unit changes the signal thresholds based on the signal values indicating the upper limit values of the output dynamic ranges of the respective plurality of images, and decides on the composition percentages based on the changed signal thresholds.

2. The image processing apparatus according to claim 1, wherein the decision unit decides on the composition percentages of the plurality of images further based on the exposure amounts of the plurality of images.

3. The image processing apparatus according to claim 2, wherein the signal values indicating the upper limit value of the output dynamic ranges are specified by performing exposure coordination for the plurality of images.

4. The image processing apparatus according to claim 3, wherein the decision unit corrects the signal values indicating the upper limit values of the output dynamic ranges of the respective plurality of images based on the exposure amounts of the plurality of images, and decides on the composition percentages of the plurality of images based on the corrected signal values indicating the upper limit values of the output dynamic ranges of the plurality of images.

5. The image processing apparatus according to claim 4, wherein the correction is processing for causing the exposure amount of one of the plurality of images to coincide with the exposure amount of another of the plurality of images through gain adjustment.

6. The image processing apparatus according to claim 4, wherein the decision unit decides on the composition percentages so that the plurality of images are not composited with respect to signal ranges that exceed the post-correction upper limit values of the output dynamic ranges of the plurality of images.

7. The image processing apparatus according to claim 4, the at least one processor and/or circuit is further configured to function as a comprising unit configured to obtain a base Mix table that, with respect to a signal range in which the plurality of images are composited, defines a signal threshold that is used as a base in switching tendencies of the composition percentages of the respective plurality of images, wherein the decision unit configures a changed Mix table by changing the signal threshold of the base Mix table based on the corrected signal values indicating the upper limit values of the output dynamic ranges of the plurality of images, and decides on the composition percentages based on the changed Mix table.

8. The image processing apparatus according to claim 4, wherein each of the plurality of images is an image obtained by nonlinearizing signal values with an application of gamma, and the decision unit performs the correction after performing linearization by applying de-gamma to the signal values indicating the upper limit values of the output dynamic ranges of the respective plurality of images.

9. The image processing apparatus according to claim 1, wherein the signal value which indicates the upper limit value of the output dynamic range and which is specified by the specification unit with respect to at least one of the plurality of images, is decided on in accordance with an image capturing mode that has been set at the time of image capture of the image.

10. The image processing apparatus according to claim 1, wherein the signal value which indicates the upper limit value of the output dynamic range, and which is specified by the specification unit with respect to at least one of the plurality of images, is smaller than a maximum signal value of a bit depth of the image.

11. The image processing apparatus according to claim 1, wherein a signal range for which the decision unit decides on the composition percentages is a luminance range.

12. The image processing apparatus according to claim 1, wherein a signal range for which the decision unit decides on the composition percentages is a signal range of signals of any color.

13. The image processing apparatus according to claim 1, the at least one processor and/or circuit is further configured to function as following units:

a composition unit configured to generate a composite image by compositing the plurality of images based on the composition percentages that have been decided on by the decision unit; and an output unit configured to output the composite image generated by the composition unit as an image file, wherein the output unit includes information of a signal value indicating an upper limit value of an output dynamic range of the composite image in the image file, and outputs the image file.

14. The image processing apparatus according to claim 13, wherein the specification unit specifies the signal value indicating the upper limit value of the output dynamic range of one of the plurality of images that has been captured with the highest exposure, and the upper limit value of the output dynamic range of the composite image is decided on based on the signal value indicating the upper limit value of the output dynamic range of one of the plurality of images that has been captured with the highest exposure, and on an exposure amount of the image.

15. The image processing apparatus according to claim 1, wherein the exposure amounts are determined based on a diaphragm, a shutter speed, and an ISO sensitivity at the time of image capture.

16. The image processing apparatus according to claim 1, wherein each of the plurality of images is an image that is represented based on a Perceptual Quantization (PQ) method.

17. An image capturing apparatus, comprising:

the image processing apparatus according to claim 1; and an image capturing unit for capturing the plurality of images with different exposure amounts.

18. A control method for an image processing apparatus that composites a plurality of images that have been captured with different exposure amounts, the method comprising:

specifying a signal value indicating an upper limit value of an output dynamic range with respect to at least one of the plurality of images;

deciding on composition percentages of the plurality of images based on the signal value specified in the specifying; and obtaining signal thresholds that are used as a base in switching tendencies of the composition percentages of the respective plurality of images, wherein deciding on the composition percentages includes:

changing the signal thresholds based on the signal values indicating the upper limit values of the output dynamic ranges of the respective plurality of images; and deciding on the composition percentages based on the changed signal thresholds.

19. A non-transitory computer-readable storage medium storing a program that causes a computer to function as each unit of the image processing apparatus according to claim 1.

* * * * *